(12) United States Patent
Chi et al.

(10) Patent No.: US 9,165,622 B2
(45) Date of Patent: Oct. 20, 2015

(54) ADDRESS DETECTION CIRCUIT AND MEMORY DEVICE INCLUDING THE SAME

(71) Applicant: SK hynix Inc., Gyeonggi-do (KR)

(72) Inventors: Sung-Soo Chi, Gyeonggi-do (KR); Young-Sik Heo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/296,060

(22) Filed: Jun. 4, 2014

(65) Prior Publication Data

US 2015/0179242 A1 Jun. 25, 2015

(30) Foreign Application Priority Data

Dec. 19, 2013 (KR) ................. 10-2013-0159299

(51) Int. Cl.
*G11C 11/00* (2006.01)
*G11C 8/04* (2006.01)
*G11C 11/406* (2006.01)

(52) U.S. Cl.
CPC ............... *G11C 8/04* (2013.01); *G11C 11/406* (2013.01)

(58) Field of Classification Search
CPC .............................. G11C 11/406; G11C 8/08
USPC ............................................ 365/222, 230.06
See application file for complete search history.

(56) References Cited

U.S. PATENT DOCUMENTS

| 4,570,221 | A | * | 2/1986 | Martens | ......................... 711/158 |
| 2007/0183242 | A1 | * | 8/2007 | Miyamoto | ................... 365/222 |
| 2008/0263268 | A1 | * | 10/2008 | Muraki | ......................... 711/104 |
| 2009/0055697 | A1 | | 2/2009 | Radke et al. | |
| 2013/0326162 | A1 | | 12/2013 | Moon et al. | |
| 2014/0078845 | A1 | * | 3/2014 | Song | ............................ 365/222 |

FOREIGN PATENT DOCUMENTS

| KR | 1020130037555 | 4/2013 |
| KR | 1020140139848 | 12/2014 |
| KR | 1020150033950 | 4/2015 |

\* cited by examiner

*Primary Examiner* — Michael Tran
(74) *Attorney, Agent, or Firm* — IP & T Group LLP

(57) ABSTRACT

An address detection circuit may include one or more address storage units, an initialization unit suitable for deleting an address stored in an address storage unit having a value greater than N, wherein the value is obtained by dividing a respective total input number that addresses have been inputted after the corresponding address is stored by a respective input number corresponding to the stored address, a detection unit suitable for detecting an address having an input number that is a reference number or more from the addresses stored in the one or more address storage units, and a selection unit suitable for selecting an address storage unit in which an address is not stored and storing an input address in the selected address storage unit.

20 Claims, 9 Drawing Sheets

ADDRESS DETECTION CIRCUIT AND MEMORY DEVICE INCLUDING THE SAME

CROSS-REFERENCE TO RELATED APPLICATION(S)

The present application claims priority of Korean Patent Application No. 10-2013-0159299, filed on Dec. 19, 2013, which is incorporated herein by reference in its entirety.

BACKGROUND

1. Field

Exemplary embodiments of the present invention relate to an address detection circuit and a memory device.

2. Description of the Related Art

A memory cell of a memory device includes a transistor operating as a switch and a capacitor which stores a charge, which corresponds to data. The data is divided into 'High' (logic 1) or 'Low' (logic 0) depending on whether a charge is present in the capacitor of the memory cell, that is, whether the terminal of the capacitor has a high voltage level.

In principle, the retention of data does not consume power because data is retained as an accumulated charge in the capacitor. However, data may be lost as the initial amount of charge stored in the capacitor is reduced due to current leakage in the PN junction of the MOS transistor. In order to prevent this concern, data within a memory cell needs to be read before the data is lost and capacitor needs to be recharged. Such an operation must be periodically repeated to maintain the data. The process of recharging cells is referred to as a refresh operation.

FIG. 1 is a diagram showing part of a cell array in a memory device which will be used to describe a word line disturbance phenomenon. In FIG. 1, BL0 and BL1 denote bit lines.

In FIG. 1, WLK−1, WLK, and WLK+1 denote word lines arranged in parallel in the cell array. The word line WLK indicated by HIGH_ACT is a highly active word line (or a frequently activated word line) that has a high activation number (or frequency), and the word lines WLK−1 and WLK+1 are adjacent to the word line WLK. CELL_K−1, CELL_K, and CELL_K+1 denote memory cells coupled to the respective word lines WLK−1, WLK, and WLK+1. The memory cells CELL_K−1, CELL_K, and CELL_K+1 include cell transistors TR_K−1, TR_K, and TR_K+1 and cell capacitors CAP_K−1, CAP_K, and CAP_K+1, respectively.

In FIG. 1, when the word line WLK becomes active and precharged (or deactivated), the amount of charge stored in the cell capacitors CAP_K−1 and CAP_K+1 is influenced by the rise and fall of voltages at word lines WLK−1 and WLK+1 due to a coupling phenomenon generated between the word line WLK and the adjacent word lines WLK−1 and WLK+1. Accordingly, if the word line WLK is toggled between an active state and a precharge state, data stored in the memory cells CELL_K−1 and CELL_K+1 may be damaged due to a change in the amount of charge stored in the cell capacitors CAP_K−1 and CAP_K+1.

Furthermore, data stored in a memory cell may be damaged because electrons within the cell capacitor of a memory cell coupled to an adjacent to word line are introduced and drained due to an electromagnetic wave that is generated when a word line is toggled between an active state and a precharge state.

SUMMARY

Various embodiments are directed to providing an address detection circuit and a memory device which consumes less area by minimizing the number of addresses that need to be stored to detect a highly active word line.

Also, various embodiments are directed to providing an address detection circuit and a memory device, which may prevent word line disturbance potential data loss by refreshing a word line adjacent to a detected highly active word line.

In an embodiment of the present invention, an address detection circuit may include one or more address storage units; an initialization unit suitable for deleting an address stored in an address storage unit having a value greater than N, wherein the value is obtained by dividing a respective total input number that addresses have been inputted after the corresponding address is stored by a respective input number corresponding to the stored address; a detection unit suitable for detecting an address having an input number that is greater than or equal to a reference number stored in the one or more address storage units; and a selection unit suitable for selecting an address storage unit in which an address is not stored and storing an input address in the selected address storage unit.

In an embodiment of the present invention, an address detection circuit may include one or more address storage units; an initialization unit suitable for deleting an address stored in an address storage unit, which has a mean input number for the corresponding address less than a predetermined number; a detection unit suitable for detecting an address having an input number that is a reference number or more from addresses stored in the one or more address storage units; and a selection unit suitable for selecting an address storage unit in which an address is not stored and storing an input address in the selected address storage unit.

In an embodiment of the present invention, a memory device may include a plurality of word lines having one or more memory cells coupled thereto; an address detection unit suitable for storing an address inputted along with an active command, deleting an address whose mean input number is less than 1 per N address inputs, of stored addresses, and detecting an address whose input number is a reference number or more from the stored addresses; and a control unit suitable for activating a word line corresponding to an inputted address in response to the active command and refreshing a word line selected using the address detected by the address detection unit.

DETAILED DESCRIPTION

Figure 1:
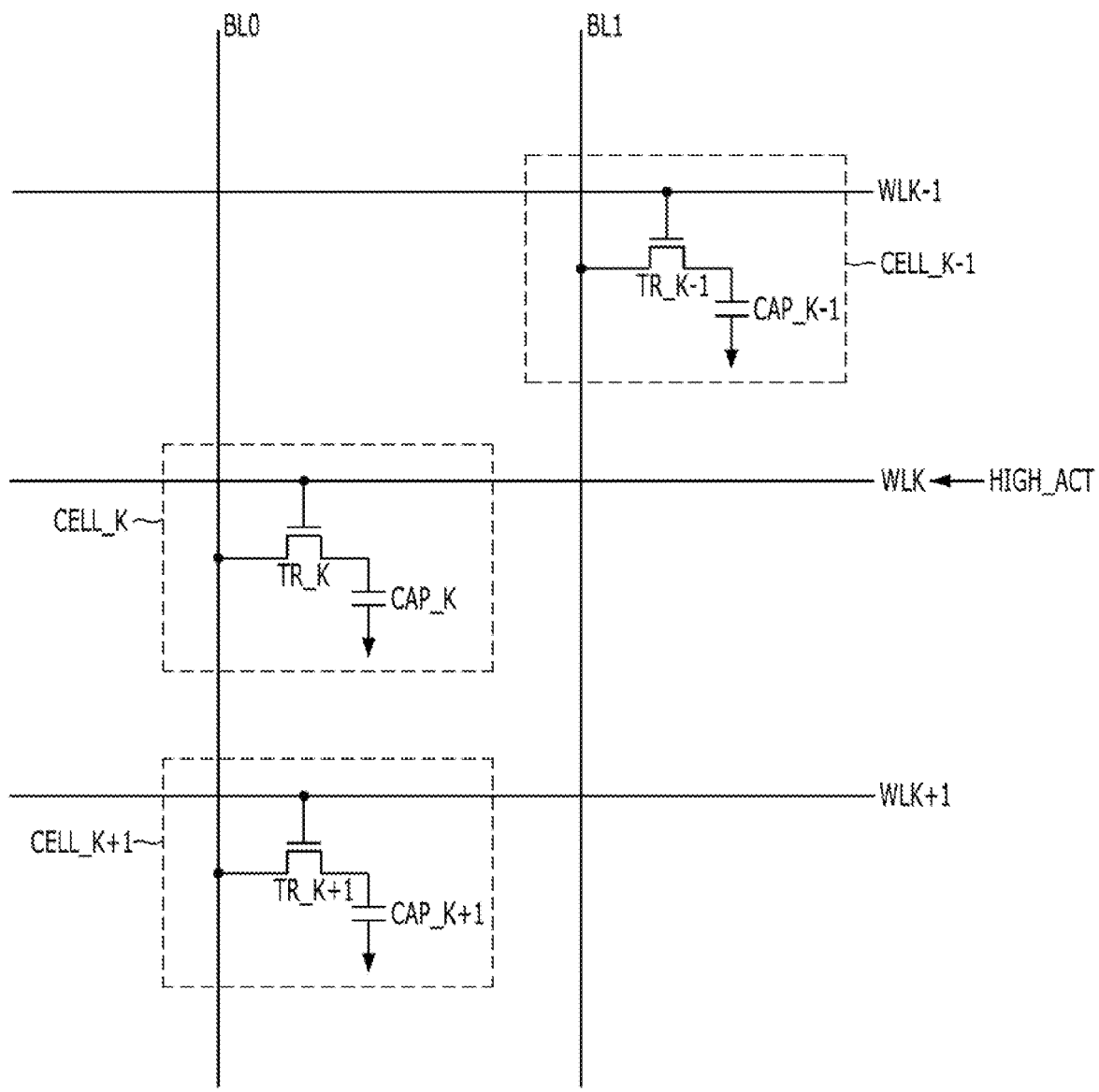
FIG. 1 is a diagram showing part of a cell array that is included in a memory device to describe a word line disturbance phenomenon.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments. The drawings are not necessarily to scale and, in some instances, proportions may have been exaggerated in order to clearly illustrate features of the embodiments. In this specification, specific terms have been used. The terms are used to describe the present invention and are not used to qualify the sense or limit the scope of the present invention. It is also noted that in this specification, 'and/or' represents that one or more of components arranged before and after 'and/or' is included. Furthermore, "connected/coupled" refers to one component not only directly coupling another component but also indirectly coupling another component through an intermediate component. In addition, a singular form may include the plural form, and vice versa, as long as it is not specifically mentioned. Furthermore, 'include/comprise' or 'including/comprising' used in the specification represents that one or more components, steps, operations, and elements exists or are added.

Hereinafter, a highly active word line (or a frequently activated word line) may indicate a word line whose activation number is a reference number or more, and a highly active address (or highly input address) may indicate an address of a highly active word line. A normal refresh operation may indicate an operation in which a memory device sequentially refreshes a plurality of word lines, and a target refresh operation may indicate an operation in which the memory device refreshes one or more word lines adjacent to a highly active word line.

Figure 2:
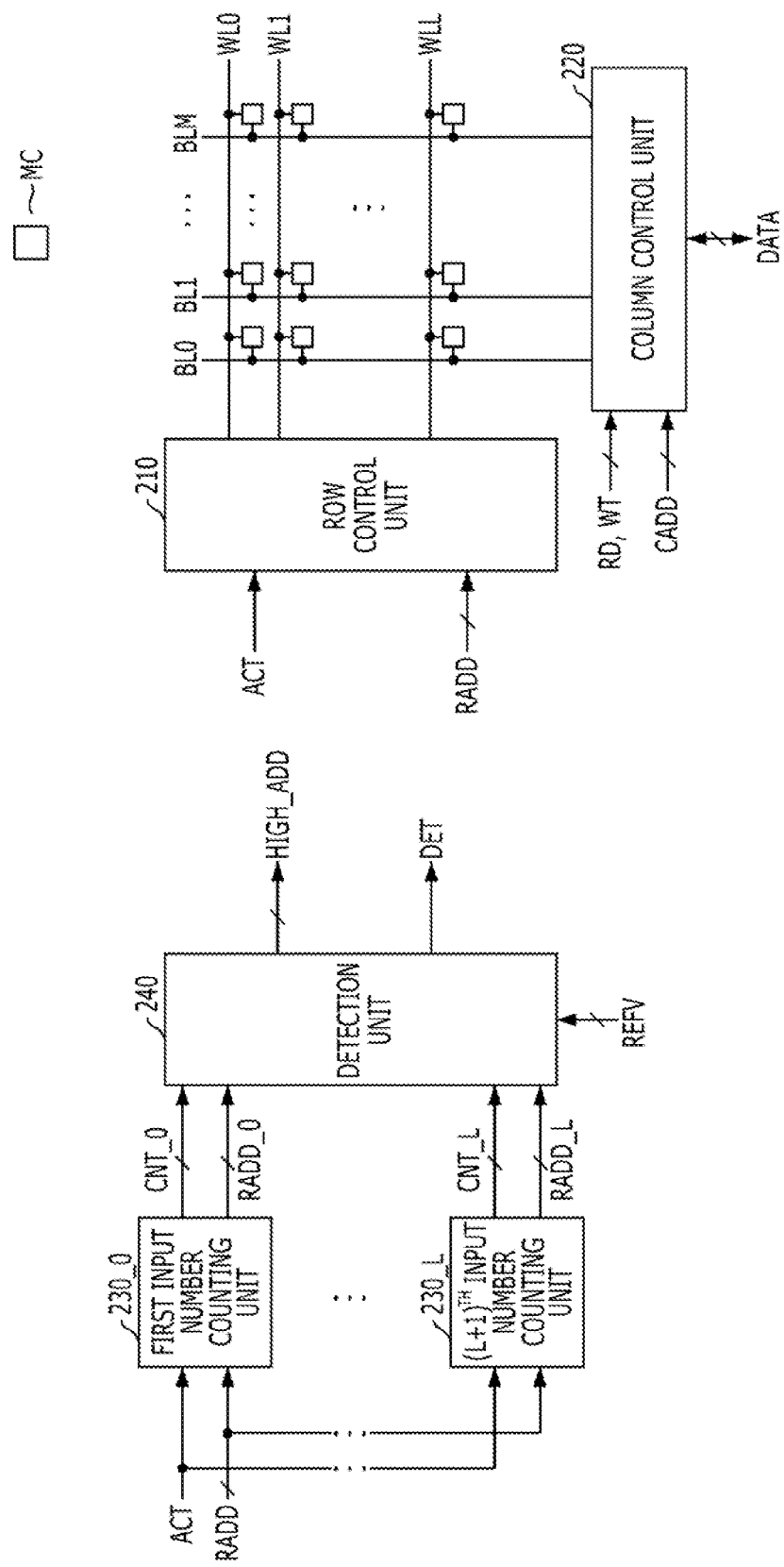
FIG. 2 is a diagram showing part of a memory device to describe a process of detecting a highly active word line.

FIG. 2 is a diagram showing part of a memory device to describe a process of detecting a highly active word line.

As shown in FIG. 2, the memory device may include a row control unit 210, a column control unit 220, a plurality of word lines WL0 to WLL, a plurality of bit lines BL0 to BLM, a plurality of input number counting units 230_0 to 230_L corresponding to the respective word lines WL0 to WLL, and a detection unit 240.

When an active command ACT is activated, the row control unit 210 may activate a word line corresponding to a row address RADD that belongs to the plurality of word lines WL0 to WLL. When a read command RD is activated, the column control unit 220 may read data DATA of memory cells coupled to a bit line corresponding to a column address CADD of memory cells MC coupled to an activated word line. When a write command WT is activated, the column control unit 220 may write data DATA into memory cells coupled to a bit line corresponding to a column address CADD of memory cells MC coupled to an activated word line. If the row address RADD received along with the active command ACT is an address of a corresponding word line, the plurality of input number counting units 230_0 to 230_L may perform counting and output respective counted results CNT_0 to CNT_L. The plurality of input number counting units 230_0 to 230_L may output addresses RADD_0 to RADD_L of the respective word lines.

The detection unit 240 compares the plurality of counting results CNT_0 to CNT_L with a reference value REFV corresponding to a reference number. If, as a result of the comparison, a word line whose activation number is the reference number or more is detected, the detection unit 240 may activate a detection signal DET and output an address of the word line whose activation number is the reference number or more, of the addresses RADD_0 to RADD_L, as a highly active address HIGH_ADD.

The plurality of input number counting units 230_0 to 230_L may include a comparison circuit (not shown in FIG. 2) for comparing an input row address RADD with the addresses RADD_0 to RADD_L of the respective word lines and a counting circuit (not shown in FIG. 2) for performing counting based on results of the comparison of the comparison circuit. The memory device requires hundreds to thousands of input number counting units 230_0 to 230_L because it includes hundreds to thousands of word lines. Accordingly, the size of the memory device for detecting a highly active address may be greatly increased.

Figure 3:
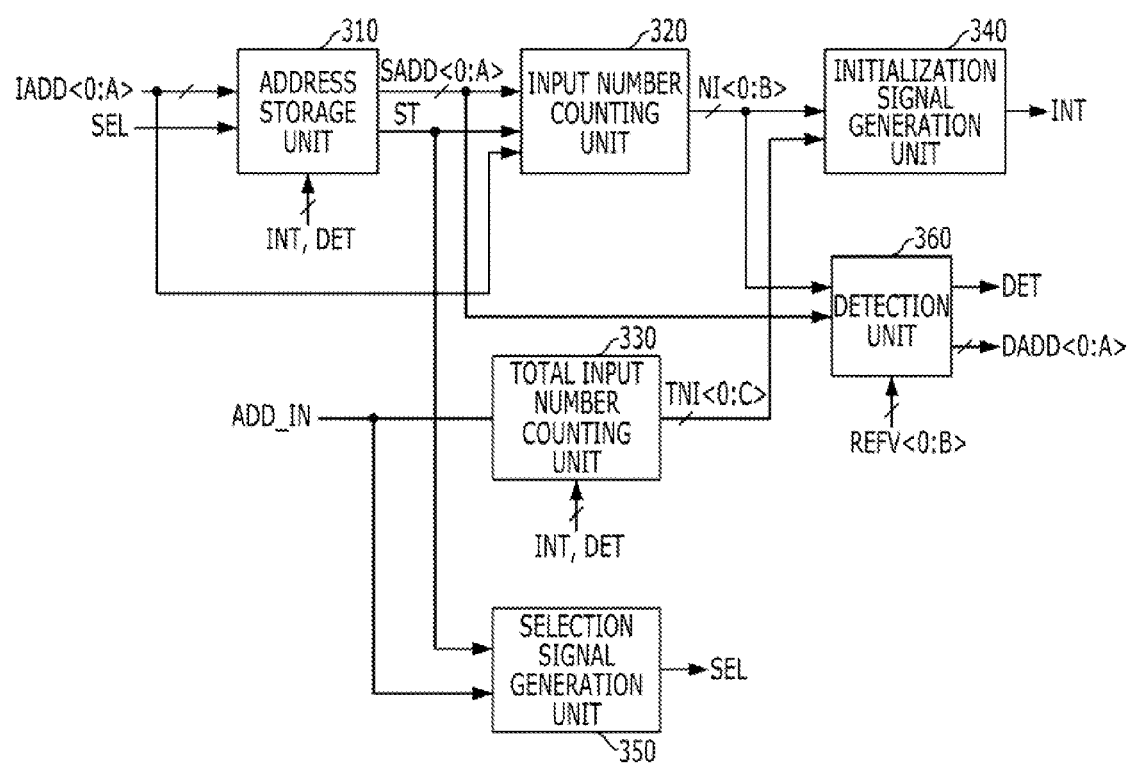
FIG. 3 is a diagram showing an address detection circuit in accordance with an embodiment of the present invention.

FIG. 3 shows an address detection circuit in accordance with an embodiment of the present invention.

As shown in FIG. 3, the address detection circuit may include an address storage unit 310, an input number counting unit 320, a total input number counting unit 330, an initialization signal generation unit 340, a selection signal generation unit 350, and a detection unit 360.

The address detection circuit is described below with reference to FIG. 3.

The address storage unit 310 may store an input address IADD<0:A> when a selection signal SEL is activated. When addresses are stored, the address storage unit 310 may activate a storage signal ST and output stored addresses SADD<0:A>. When an initialization signal INT or a detection signal DET is activated, the address storage unit 310 may delete stored addresses and reset a stored value to an initial value.

The input number counting unit 320 generates an input number counting value NI<0:B>, and may increase the input number counting value NI<0:B> if the storage signal ST is activated or the input address IADD<0:A> is identical with the addresses SADD<0:A> stored in the address storage unit 310. When the initialization signal INT or the detection signal DET is activated, the input number counting unit 320 may reset the input number counting value NI<0:B> to an initial value (e.g., a value corresponding to a zero number).

The total input number counting unit 330 may generate a total input number counting value TNI<0:C> by counting the total number of times that addresses have been inputted from when the addresses SADD<0:A> stored in the address storage unit 310 were updated. The total input number counting unit 330 may increase the total input number counting value TNI<0:C> by 1 whenever an address input signal ADD_IN is activated. The address input signal ADD_IN may be a signal that is activated whenever an address is inputted to the address detection circuit. The total input number counting value TNI<0:C> may correspond to the total number of times that addresses have been inputted to the address detection circuit from when stored addresses SADD<0:A> were stored in the address storage unit 310. When the initialization signal INT or the detection signal DET is activated, the total input number counting unit 330 may reset the total input number counting value TNI<0:C> to an initial value (e.g., a value corresponding to a zero number).

If a value obtained by dividing the total input number counting value TNI<0:C> by the input number counting value NI<0:B> is greater than N, the initialization signal generation unit 340 may activate the initialization signal INT. If the value obtained by dividing the total input number counting value TNI<0:C> by the input number counting value NI<0:B> is greater than N, it may mean that the addresses SADD<0:A> have been inputted one or more times per N address inputs after they were inputted to the address detection circuit.

When the storage signal ST is deactivated and the address input signal ADD_IN is activated, the selection signal generation unit 350 may activate the selection signal SEL. That is, when the addresses IADD<0:A> are inputted to the address detection circuit, if addresses are not stored in the address storage unit 310, the selection signal generation unit 350 may select the address storage unit 310 so that the inputted addresses IADD<0:A> may be stored.

The detection unit 360 may compare the input number counting value NI<0:B> with a reference value REFV<0:B> corresponding to a reference number. If, as a result of the comparison, the input number of the addresses SADD<0:A> becomes the reference number or more, the detection unit 360 may activate the detection signal DET and output the addresses SADD<0:A> as addresses DADD<0:A>.

Figure 4:
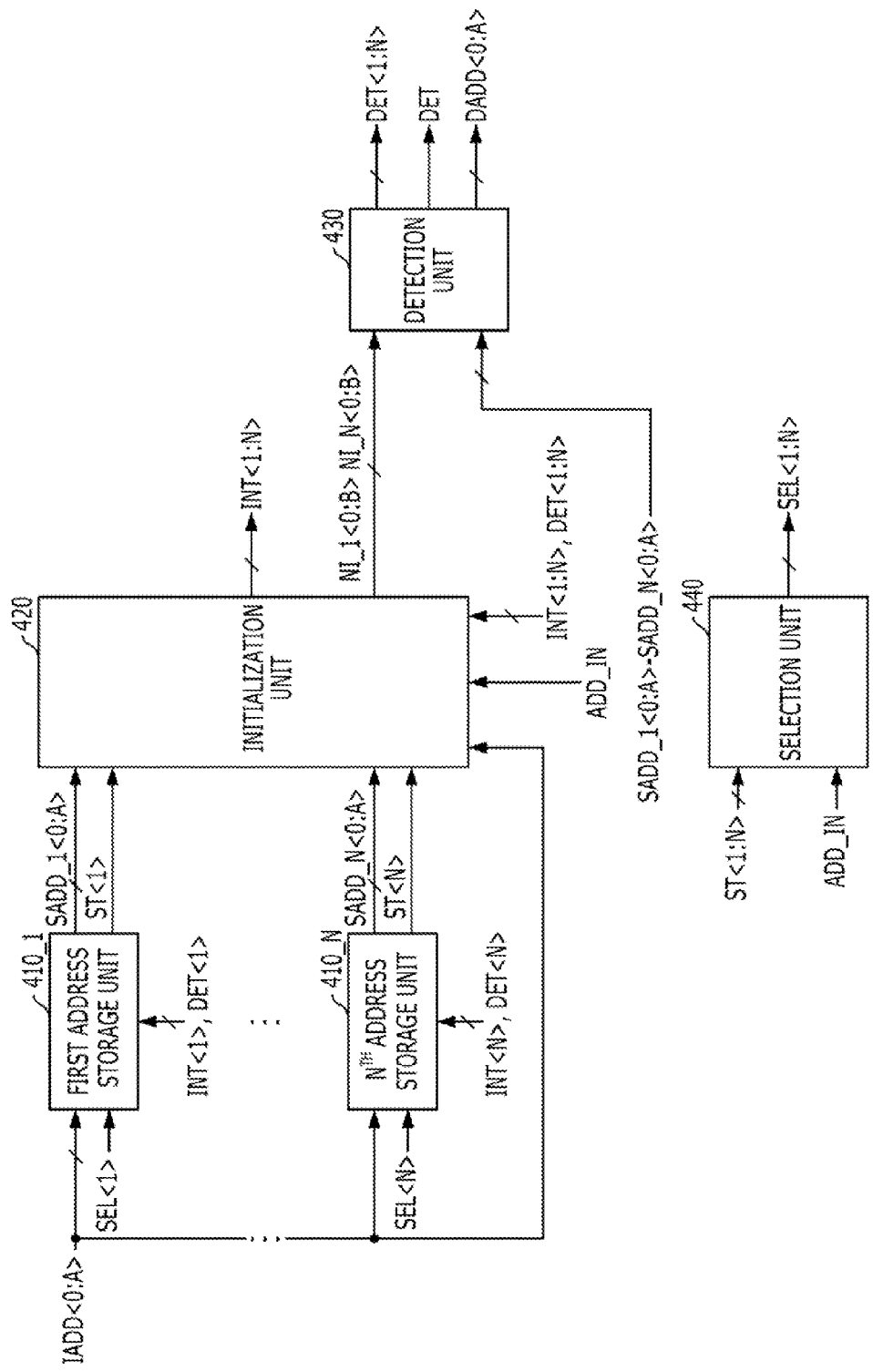
FIG. 4 is a diagram showing an address detection circuit in accordance with an embodiment of the present invention.

FIG. 4 shows an address detection circuit in accordance with an embodiment of the present invention.

As shown in FIG. 4, the address detection circuit may include one or more address storage units 410_1 to 410_N, an initialization unit 420, a detection unit 430, and a selection unit 440.

The address detection circuit is described below with reference to FIG. 4.

The address storage units 410_1 to 410_N may store the input address IADD<0:A> when respective selection signals SEL<1:N> are activated. When the input address IADD<0:A> is stored, the address storage units 410_1 to 410_N may activate respective storage signals ST<1:N> and output respective stored addresses SADD_1<0:A> to SADD_N<0:A>. When respective initialization signals INT<1:N> are activated or respective detection signals DET<1:N> are activated, the address storage units 410_1 to 410_N may delete stored addresses and reset stored values to an initial value. The initialization unit 420 may delete an address stored in an address storage unit when a mean input number for the corresponding stored address is less than 1 per N address inputs. The corresponding stored address belongs to one of the addresses SADD_1<0:A> to SADD_N<0:A> stored in the address storage units 410_1 to 410_N.

The initialization unit 420 may generate the initialization signals INT<1:N>, and may activate an initialization signal corresponding to the address storage unit in which the address having the mean input number less than 1 per N address inputs is stored. The mean input number may correspond to a value obtained by multiplying a value, obtained by dividing the input number corresponding address SADD_1<0:A> to SADD_N<0:A> stored in the address storage units 410_1 to 410_N by a total input number that addresses have been inputted after the corresponding address is stored in the corresponding address storage unit, and N. That is, the mean input number of a specific address may indicate the input number of the specific address while the addresses are inputted to the address detection circuit N times after the specific address was inputted.

In order to use the mean input number of the addresses SADD_1<0:A> to SADD_N<0:A> stored in the address storage units 410_1 to 410_N, the initialization unit 420 may generate an input number counting value NI_1<0:B> to NI_N<0:B> corresponding to the number of times that the addresses SADD_1<0:A> to SADD_N<0:A> stored in the address storage units 410_1 to 410_N have been inputted. Each of the input number counting values NI_1<0:B> to NI_N<0:B> may be increased by 1 if a corresponding address stored in a corresponding address storage unit is inputted (when the input address IADD<0:A> is identical with the address stored in each address storage unit).

The detection unit 430 may receive the input number counting value NI_1<0:B> to NI_N<0:B> and a reference value REFV<0:B> corresponding to a reference number, and may detect an address whose input number is the reference number or more from the addresses SADD_1<0:A> to SADD_N<0:A> stored in the address storage units 410_1 to 410_N. The detection unit 430 generates the detection signals DET<1:N>, and may activate a detection signal corresponding to a stored address whose input number is the reference number or more and output addresses corresponding to activated detection signals, of the stored addresses SADD_1<0:A> to SADD_N<0:A>, as the detection address DADD<0:A>. When one or more of the detection signals DET<1:N> are activated, the detection unit 430 may activate a final detection signal DET.

When an address is inputted to the address detection circuit, the selection unit 440 may select an address storage unit in which an address has not been stored from the address storage units 410_1 to 410_N and store an input address IADD<0:A> in the selected address storage unit. If the number of address storage units in which an address has not been stored, of the address storage units 410_1 to 410_N, is two or more, the selection unit 440 may select an address storage unit having an earlier serial number and store an address in the selected address storage unit. For example, if an address is unable to be stored in the second address storage unit 410_2, the fourth address storage unit 410_4, and the seventh address storage unit 410_7, the selection unit 440 may select the second address storage unit 410_2.

The selection unit 440 receives storage signals ST<1:N>. When an address input signal ADD_IN is activated by an address inputted to the address detection circuit, the selection unit 440 may activate one of selection signals SEL<1:N>. The selection unit 440 activates a selection signal corresponding to a deactivated storage signal, and may activate a selection signal having an earlier serial number if the number of deactivated storage signals is two or more. For example, if the second storage signal ST<2>, the fourth storage signal ST<4>, and the seventh storage signal ST<7> are deactivated, when the address input signal ADD_IN is activated, the selection unit 440 may activate the second selection signal SEL<2>.

N, that is, the number of address storage units included in the address detection circuit and a standard on which an address storage unit initialized by the initialization unit 420 is selected, may be a natural number that is equal to or greater than a value obtained by dividing a total number of times (also called a 'total input number' hereinafter) that an address has been inputted to the address input circuit in a set section by a reference number.

A highly active address whose input number in the set section is the reference number or more highly input may not be greater than a value obtained by dividing a total number of times that an address has been inputted to the address detection circuit in a set section by the reference number. Accordingly, the number N of address storage units included in the address detection circuit may be designed to have a value that is greater than or equal to the value obtained by dividing a total number of times that an address has been inputted to the address detection circuit in a set section by a reference number.

For example, assume that the total number of times an address has been inputted to the address detection circuit in a set section is $10^6$ and the address detection circuit detects an address inputted $1.25 \times 10^5$ times (i.e., a reference number) in the set section, as a highly active address. In such a case, the maximum number of highly active addresses that may be generated in the set section is 8. Accordingly, the address detection circuit may detect all the highly active addresses if it only has to store 8 addresses. The address detection circuit may detect a highly active address in relation to all addresses while storing only 8 addresses by deleting an address that may not become a highly active address, of stored addresses, and storing a new address.

The initialization unit 420 may delete an address whose mean input number is less than 1 per N address inputs. In order for a specific address to be inputted by a reference number or more during a set section, the number of times that the specific address is inputted, that is, the mean input number of the specific address, needs to be at least 1 or more per N address inputs at a specific time. Accordingly, the initialization unit 420 calculates a mean input number of a specific address from when the specific address was inputted. If, as a result of the calculation, the mean input number is less than 1 per N address inputs, the initialization unit 420 may delete the specific address and store another input address.

In the aforementioned example, in order for a specific address to be inputted by a reference number or more in a set section in which an address is inputted $10^6$ times, the specific address needs to be inputted 1 or more times whenever an address is inputted to the address detection circuit 8 or more times (i.e., if a mean input number is 1 per 8 address inputs, an input number becomes equal to the reference number if the specific address is inputted within the set section). Accordingly, if a mean input number is less than 1 per 8 address inputs, the specific address may be deleted because the specific address is unable to be inputted by the reference number or more although the specific address is inputted within the set section with a similar frequency.

The address detection circuit of the present invention may minimize area consumption and effectively detect a highly input active address because the number of addresses that need to be stored is minimized by taking a maximum number of highly input active addresses that may be detected in a set section into consideration.

Figure 5:
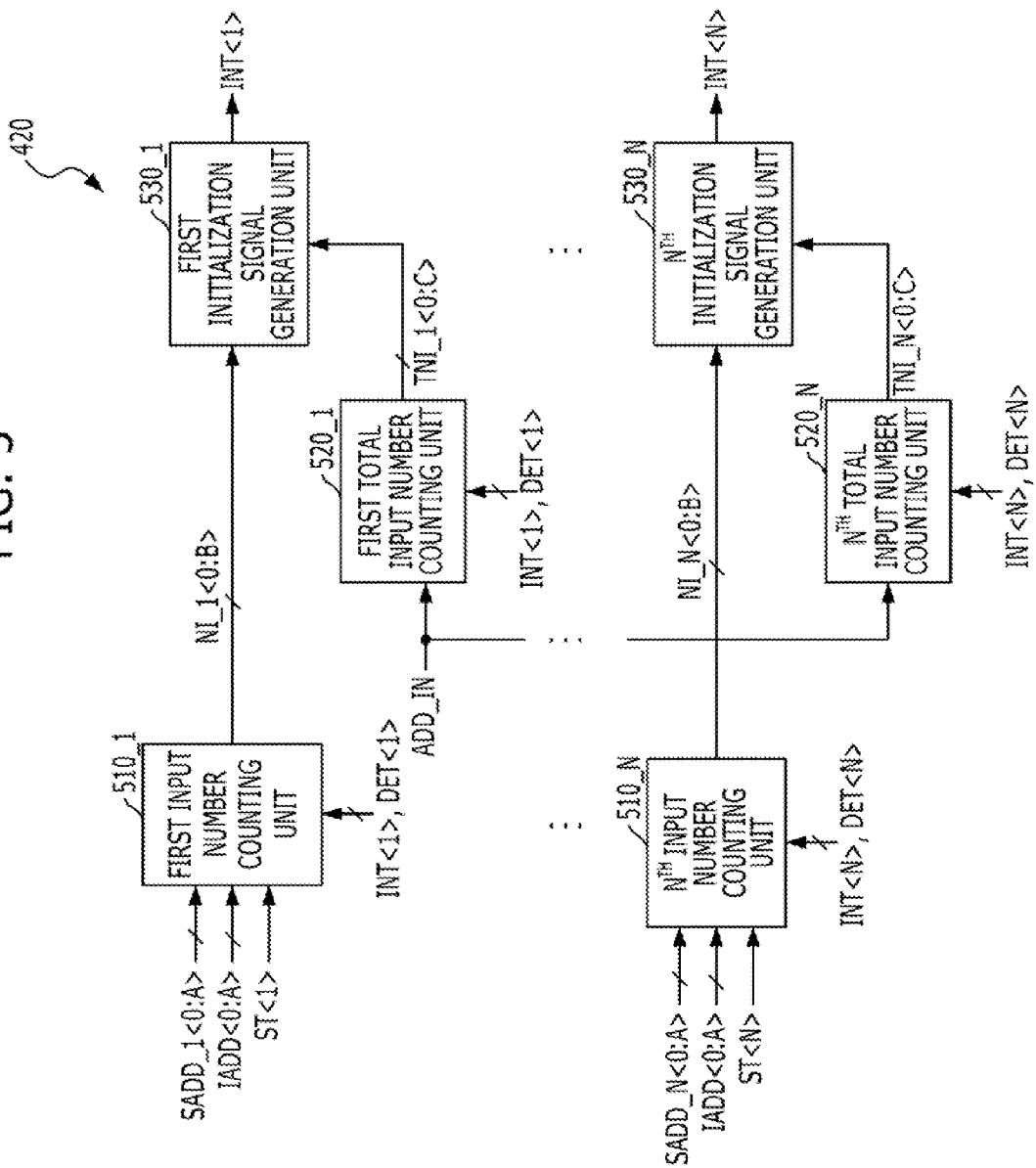
FIG. 5 is a detailed diagram of an initialization unit shown in FIG. 4.

FIG. 5 is a detailed diagram of the initialization unit 420 shown in FIG. 4.

As shown in FIG. 5, the initialization unit 420 may include first to $N^{th}$ input number counting units 510_1 to 510_N, first to $N^{th}$ total input number counting units 520_1 to 520_N, and first to $N^{th}$ initialization signal generation units 530_1 to 530_N.

The initialization unit 420 is described below with reference to FIGS. 4 and 5.

The input number counting units 510_1 to 510_N correspond to the respective address storage units 410_1 to 410_N and may count the number of times that the addresses SADD_1<0:A> to SADD_N<0:A> stored in the address storage units 410_1 to 410_N are inputted to the address detection circuit. When the corresponding initialization signals INT<1:N> or the corresponding detection signals DET<1:N> are activated, the input number counting units 510_1 to 510_N may reset the respective input number counting value NI_1<0:B> to NI_N<0:B> (e.g., a value corresponding to a zero number).

When the storage signals ST of the respective address storage units 410_1 to 410_N are activated (i.e., when an address is inputted to and stored in an address storage unit) or the addresses SADD_1<0:A> to SADD_N<0:A> stored in the respective address storage units 410_1 to 410_N are identical with the input addresses IADD<0:A>, the input number counting units 510_1 to 510_N may generate the input number counting value NI_1<0:B> to NI_N<0:B> by performing a counting operation. When the storage signals ST of the respective address storage units 410_1 to 410_N are activated or addresses identical with the addresses SADD_1<0:A> to SADD_N<0:A> stored in the respective address storage units 410_1 to 410_N are inputted, the input number counting units 510_1 to 510_N may increase the respective input number counting value NI_1<0:B> to NI_N<0:B> by 1.

The total input number counting units 520_1 to 520_N correspond to the respective address storage units 410_1 to 410_N and may count the respective total input numbers in which addresses have been inputted to the address detection circuit from when the addresses SADD_1<0:A> to SADD_N<0:A> stored in the respective address storage units 410_1 to 410_N were stored in the address detection circuit. The total input number counting units 520_1 to 520_N may increase the respective total input number counting values TNI_1<0:C> to TNI_N<0:C> by 1 whenever the address input signal ADD_IN is activated. The address input signal ADD_IN may be a signal that is activated whenever an address is inputted to the address detection circuit. Here, each of the total input number counting values TNI_1<0:C> to TNI_N<0:C> may be the total number of times that an address has been inputted to the address detection circuit from when each of the stored addresses SADD_1<0:A> to SADD_N<0:A> was stored in each of the address storage units 410_1 to 410_N. When the corresponding initialization signals INT<1:N> or the corresponding detection signals DET<1:N> are activated, the total input number counting units 520_1 to 520_N may reset the respective total input number counting values TNI_1<0:C> to TNI_N<0:C> to a value (e.g., a value corresponding to a zero number).

The initialization signal generation units 530_1 to 530_N correspond to the respective address storage units 410_1 to 410_N, the respective input number counting units 510_1 to 510_N, and the respective total input number counting units 520_1 to 520_N. The initialization signal generation units 530_1 to 530_N may calculate the mean input numbers of the addresses SADD_1<0:A> to SADD_N<0:A> stored in the respective address storage units 410_1 to 410_N and activate the respective initialization signals INT<1:N> based on results of the calculation.

The initialization signal generation units 530_1-530_N may activate the corresponding initialization signals INT<1:N> when values obtained by dividing the counting values TNI_1<0:C> to TNI_N<0:C> of the respective total input number counting units 520_1 to 520_N by the respective counting value NI_1<0:B> to NI_N<0:B> of the input number counting units 510_1 to 510_N are greater than N. Values obtained by dividing the total input number counting values TNI_1<0:C> to TNI_N<0:C> by the respective input number counting value NI_1<0:B> to NI_N<0:B> being greater than N indicates that the mean input number of a corresponding address is less than 1 per N address inputs.

The initialization unit 420 may delete an address having a mean input number that is less than 1 per N address inputs using the number of times that the addresses SADD_1<0:A> to SADD_N<0:A> stored in the address storage units 410_1 to 410_N have been inputted and total input numbers in which addresses have been inputted from when the addresses SADD_1<0:A> to SADD_N<0:A> stored in the address storage units 410_1 to 410_N were inputted.

Figure 6:
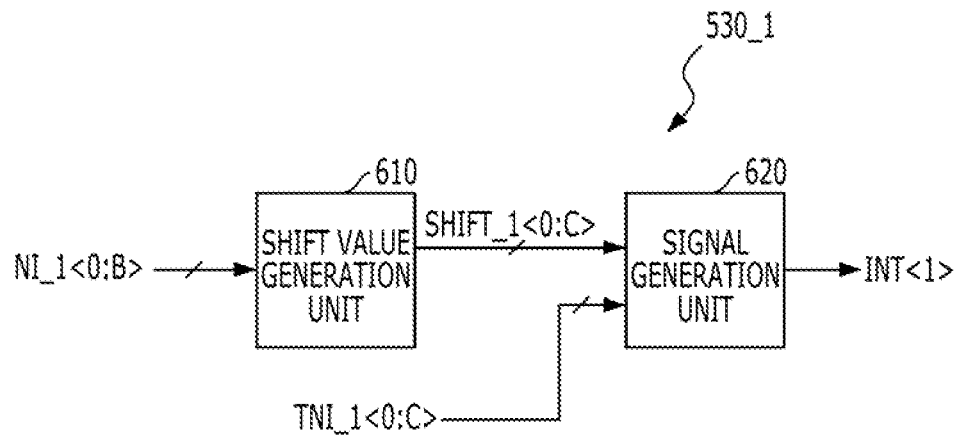
FIG. 6 is a detailed diagram of a first initialization signal generation unit shown in FIG. 5.

FIG. 6 is a detailed diagram of the first initialization signal generation unit 530_1 shown in FIG. 4.

As shown in FIG. 6, the first initialization signal generation unit 530_1 may include a shift value generation unit 610 and a signal generation unit 620.

The first initialization signal generation unit 530_1 is described below with reference to FIGS. 4 to 6.

The shift value generation unit 530_1 may generate a first shift value SHIFT_1<0:C> by shifting the first input number counting value NI_1<0:B> by set bits. The first input number counting value NI_1<0:B> is a signal of multiple bits and may be a binary number corresponding to the number of times that the address SADD_1<0:A> stored in the first address storage unit 410_1 has been inputted. If the first shift value SHIFT_1<0:C> (C=B+K) is generated by shifting the first input number counting value NI_1<0:B> by K bits, a value of a binary number corresponding to the first shift value SHIFT_1<0:C> may be a multiple of $2^K$ of a value of a binary number that corresponds to the first input number counting value NI_1<0:B>. Here, $2^K$ may be a value corresponding to 'N'.

For example, if the first shift value SHIFT_1<0:C> (C=B+3) is generated by shifting the first input number counting value NI_1<0:B> three times (i.e., 3 bits), a value of a binary number corresponding to the first shift value SHIFT_1<0:C> may be a multiple of $2^3$, that is, 8 times, of a value of a binary number that corresponds to the first input number counting value NI_1<0:B>.

The signal generation unit 620 compares the first shift value SHIFT_1<0:C> with the first total input number counting value TNI_1<0:C>. If, as a result of the comparison, the first total input number counting value TNI_1<0:C> is found to be greater than the first shift value SHIFT_1<0:C>, the signal generation unit 620 may activate the first initialization signal INT<1>. If, as a result of the comparison, the first total input number counting value TNI_1<0:C> is found to be not greater than the first shift value SHIFT_1<0:C>, the signal generation unit 620 may deactivate the first initialization signal INT<1>. The first total input number counting value TNI_1<0:C> being greater than the first shift value SHIFT_1<0:C> may mean that a value obtained by dividing the first total input number counting value TNI_1<0:C> by the first input number counting value NI_1<0:B> is greater than $2^K$. This may indicate that the mean input number of the address SADD_1<0:A> stored in the first address storage unit 410_1 is less than 1 per N address inputs.

Each of the second to $N^{th}$ initialization signal generation units 530_2 to 530_N has the same construction as the first initialization signal generation unit 530_1, and they may generate the respective second to $N^{th}$ initialization signals INT<2:N> in response to the respective input number counting values NI_2<0:B> to NI_N<0:B> and the respective total input number counting values TNI_2<0:C> to TNI_N<0:C> in the same manner as described above.

Figure 7:
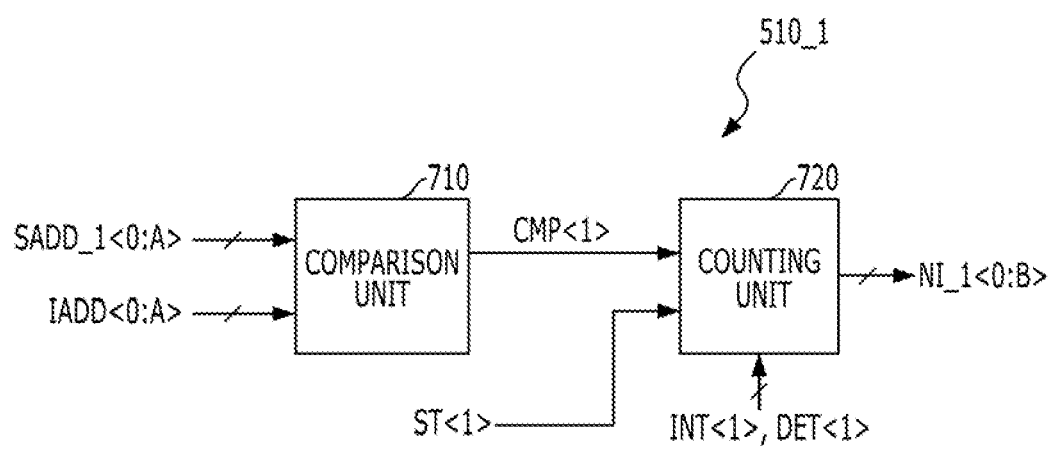
FIG. 7 is a detailed diagram of a first input number counting unit 510_1 according to an embodiment of the present invention.

FIG. 7 is a detailed diagram of the first input number counting unit 510_1 shown in FIG. 4.

As shown in FIG. 7, the first input number counting unit 510_1 may include a comparison unit 710 and a counting unit 720.

The first input number counting unit 510_1 is described below with reference to FIGS. 4, 5, and 7.

The comparison unit 710 generates a first comparison signal CMP<1>. The comparison unit 710 may deactivate the first comparison signal CMP<1> when the input address IADD<0:A> is different from the address SADD_1<0:A> stored in the first address storage unit 410_1 and activate the first comparison signal CMP<1> when the input address IADD<0:A> is the same as the address SADD_1<0:A> stored in the first address storage unit 410_1.

The counting unit 720 may generate the first input number counting value NI_1<0:B> and may increase the first input number counting value NI_1<0:B> by 1 when the first storage signal ST<1> is activated or the first comparison signal CMP<1> is activated. When the first initialization signal INT<1> or the first detection signal DET<1> is activated, the counting unit 620 may reset the first input number counting value NI_1<0:B> to an initial value.

Each of the second to $N^{th}$ input number counting units 510_2 to 510_N has the same construction as the first input number counting unit 510_1, and they may generate the respective second to $N^{th}$ input number counting values NI_2<0:B> to NI_N<0:B> in response to the input address IADD<0:A>, the respective storage signals ST<2:N>, and the respective addresses SADD_1<0:A> in the same manner as described above.

Figure 8:
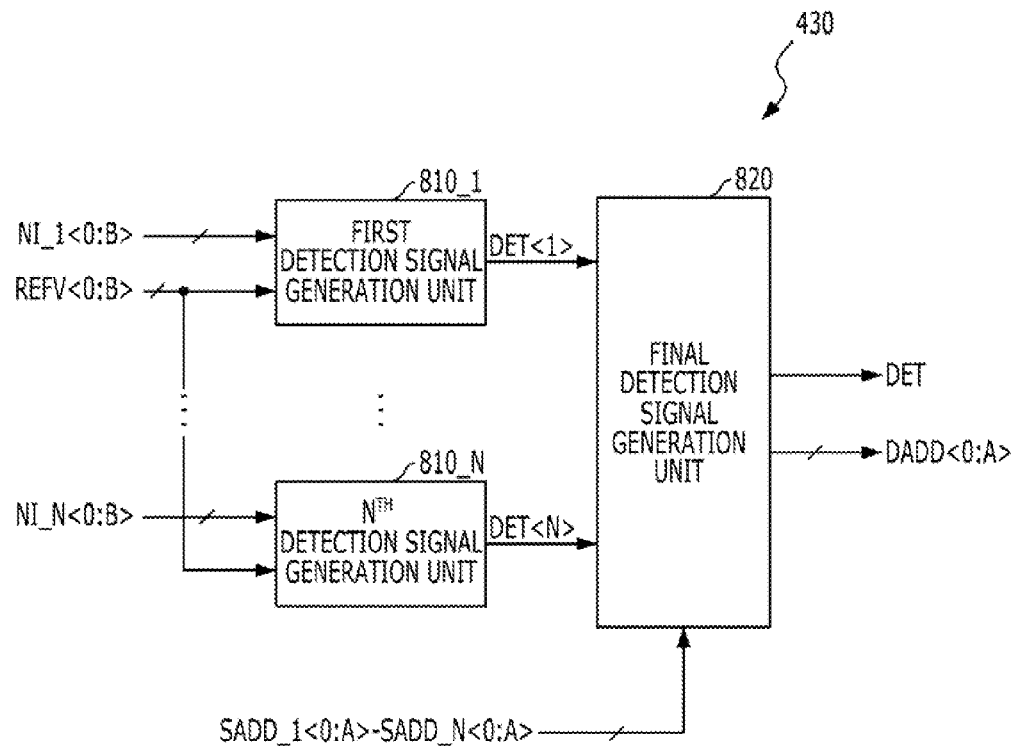
FIG. 8 is a detailed diagram of a detection unit shown in FIG. 4.

FIG. 8 is a detailed diagram of the detection unit 430 shown in FIG. 4.

As shown in FIG. 8, the detection unit 430 may include first to $N^{th}$ detection signal generation units 810_1 to 810_N and a final detection signal generation unit 820.

The detection unit 430 is described below with reference to FIGS. 4 and 8.

The first to $N^{th}$ detection signal generation units 810_1 to 810_N may compare the respective input number counting values NI 1<0:B> to NI_N<0:B> with the reference value REFV<0:B> and may activate the respective detection signals DET<1:N> if, as a result of the comparison, the input number counting values NI_1<0:B> to NI_N<0:B> are found to be the reference value REFV<0:B> or more.

The final detection signal generation unit 820 may activate the final detection signal DET when one or more of the first to $N^{th}$ detection signals DET<1:N> are activated. The final detection signal generation unit 820 may receive the addresses SADD_1<0:A> to SADD_N<0:A> stored in the address storage units 410_1 to 410_N and output addresses, corresponding to activated detection signals DET<1:N>, as the detection addresses DADD<0:A>.

Figure 9:
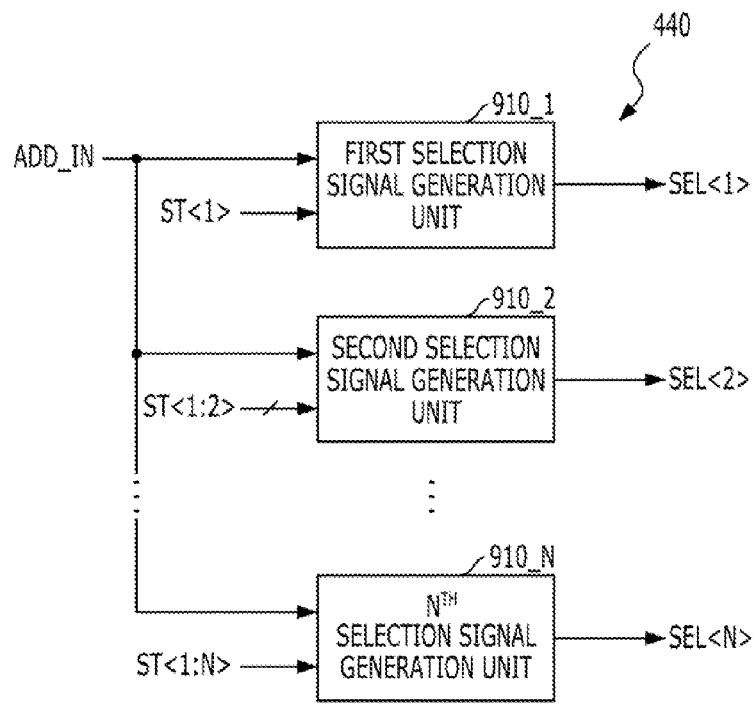
FIG. 9 is a detailed diagram of a selection unit shown in FIG. 4.

FIG. 9 is a detailed diagram of the selection unit 440 shown in FIG. 4.

As shown in FIG. 9, the selection unit 440 may include first to $N^{th}$ selection signal generation units 910_1 to 910_N.

The selection unit 440 is described below with reference to FIGS. 4 and 9.

When the first storage signal ST<1> is deactivated if the address input signal ADD_IN is activated, the first selection signal generation unit 910_1 may activate the first selection signal SEL<1>. When the first storage signal ST<1> is activated and the second storage signal ST<2> is deactivated if the address input signal ADD_IN is activated, the second selection signal generation unit 910_2 may activate the second selection signal SEL<2>. The $K^{th}$ (2≤K≤N, K is a natural number) selection signal generation unit 910_K may activate the $K^{th}$ selection signal SEL<K> when the first to (K−1)$^{th}$ storage signals ST<1:K−1> are activated and the $K^{th}$ storage signal ST<K> is deactivated if the address input signal ADD_IN is activated.

Likewise, when the address input signal ADD_IN is activated, the selection unit 440 may activate a selection signal corresponding to an address storage unit, having an address not stored therein and having an earlier serial number, that belongs to the selection signals SEL<1:N>.

Figure 10:
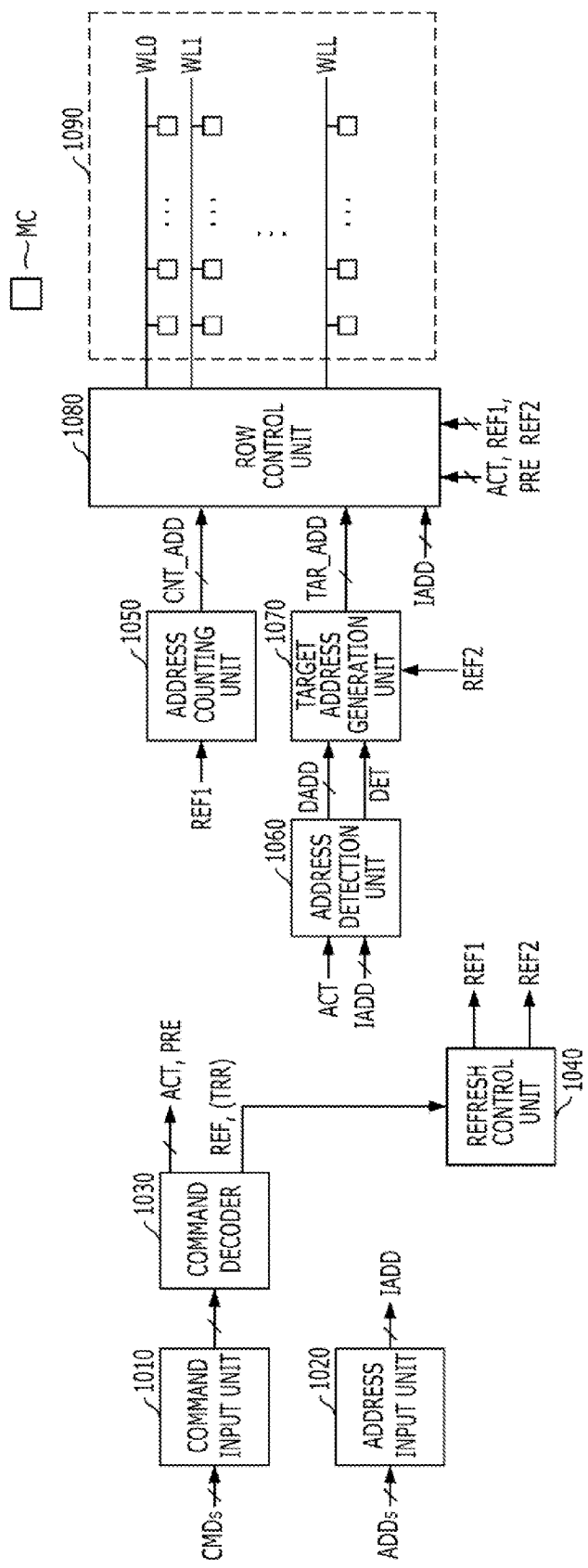
FIG. 10 is a diagram of a memory device according to an embodiment of the present invention.

FIG. 10 is a diagram of a memory device according to an embodiment of the present invention.

As shown in FIG. 10, the memory device may include a command input unit 1010, an address input unit 1020, a command decoder 1030, a refresh control unit 1040, an address counting unit 1050, an address detection unit 1060, a target address generation unit 1070, a row control unit 1080, and a cell array 1090. The cell array 1090 includes a plurality of word lines WL0 to WLL, and the word lines WL0 to WLL may be sequentially disposed.

A memory device will be described below with reference to FIG. 10.

The command input unit 1010 may receive commands CMDs, and the address input unit 1020 may receive addresses ADDs. Each of the command signals CMDs and the address ADDs may include signals of multiple bits.

The command decoder 1030 may generate an active command ACT, a precharge command PRE, and a refresh command REF by decoding the command signals CMDs received from the command input unit 1010. The command decoder 1030 may generate a target refresh command TRR depending on the design. The command decoder 1030 may activate a command indicated by a combination of the command signals CMDs that belongs to the active command ACT, the precharge command PRE, the refresh command REF, and the target refresh command TRR. In addition, the command decoder 1030 may generate a read command and a write command by decoding the command signals CMDs, but the read and write commands are not shown and described because they are not directly related to the memory device in accordance with an embodiment of the present invention.

The refresh control unit 1040 may activate a first refresh signal REF1 for a normal refresh operation and a second refresh signal REF2 for a target refresh operation. In the normal refresh operation, the memory device may sequentially refresh the plurality of word lines WL0 to WLL of the cell array 1090 in response to the refresh command REF that is received in a set cycle. In the target refresh operation, the memory device may refresh word lines adjacent to a highly active word line using an address DADD detected by the address detection unit 1060.

The refresh control unit 1040 may activate the first refresh signal REF1 in response to the refresh command REF that is periodically received and activate the second refresh signal REF2 whenever the refresh command REF is received a set number of times. For example, the refresh control unit 1040 may activate the first refresh signal REF1 whenever the refresh command REF is received, and may activate the second refresh signal REF2 whenever the refresh command REF is received four times. Alternatively, the refresh control unit 1040 may activate the first refresh signal REF1 in response to the refresh command REF that is periodically received, and may activate the second refresh signal REF2 in response to the refresh command REF when the detection signal DET is activated. Alternatively, the refresh control unit 1040 may activate the first refresh signal REF1 in response to the refresh command REF that is periodically received, and may activate the second refresh signal REF2 when the target refresh command TRR is activated.

As described above, the refresh control unit 1040 may activate the first refresh signal REF1 and the second refresh signal REF2 in various ways. The memory device may perform a normal refresh operation when the first refresh signal REF1 is activated and perform a target refresh operation when the second refresh signal REF2 is activated.

The address counting unit 1050 may generate a counting address CNT_ADD having a value varied whenever the word lines WL0 to WLL are refreshed. The address counting unit 1050 may increase a value of the counting address CNT_ADD by 1 whenever the first refresh signal REF1 is activated. The counting address CNT_ADD is used as an address for selecting a word line that will be refreshed in a normal refresh operation. The purpose of increasing the counting address CNT_ADD by 1 is so a $(K+1)^{th}$ word line WLK+1 is selected next if a $K^{th}$ word line WLK was previously selected.

The address detection unit 1060 may receive the active command ACT and an input address IADD and detect a highly active address. The address detection unit 1060 may be the address detection circuit of FIG. 4. The active command ACT may correspond to the address input signal ADD_IN of FIG. 4, and the input address IADD may correspond to the addresses IADD<0:A> that are inputted to the address detection circuit in FIG. 4. The input address IADD may be a row address for selecting a word line that will be activated based on an address inputted in accordance with the active command ACT.

The address detection unit 1060 may store a maximum of N addresses and delete an address having a mean input number that is less than 1 per N address inputs that belong to stored addresses. If an address whose input number is a reference number or more from a stored address is detected, the address detection unit 1060 may activate a detection signal DET and output the detected address DADD. N, the number of addresses that may be stored in the address detection unit 1060 of the memory device and a criterion for selecting an address to be deleted, may be a natural number that is greater than or equal to a value obtained by dividing the total number of times that an address has been inputted to the address detection unit 1060 in a set section by a reference number. The number of times that a specific address has been inputted may correspond to the number of times that a word line corresponding to the specific address has been activated, and a total input number from when a specific address was stored may indicate a total active operation number that has been performed by the memory from when the specific address was inputted.

The number of highly active word lines whose activation number is a reference number or more in a set section may not be greater than a value obtained by dividing a total number of active operations in the set section by the reference number. Accordingly, the address detection unit 1060 may be designed to store addresses greater than a value obtained by dividing a total number of active operations in the set section by the reference number.

For example, assume that a total number of active operations during a set section is 10^6 and the address detection unit 1060 detects a word line that has been activated 1.25×10^5 times (i.e., a reference number) during the set section as a highly active word line and detects an address of the highly active word line as a highly active address. Here, the set section may be the time that is taken for the plurality of word lines WL0 to WLL of the cell array 1090 to be refreshed once through normal refresh (e.g., tRFC defined in SPEC).

In such a case, the maximum number of highly active word lines may be 8 during the set section (the same principle applies to the highly active address). Accordingly, the address detection unit 1060 may detect all the highly active addresses if it only has to store 8 addresses. The address detection unit 1060 may detect a highly active address while storing a total of only 8 addresses by deleting addresses that are not highly active addresses, and storing a new address.

For a reason similar to that described with reference to FIG. 4, the address detection unit 1060 may delete an address of a word line that has a mean activation number (corresponding to a mean input number) less than 1 per N active operations. In the above example, in order for the number of times that a specific word line becomes active to become a reference number or more in the set section in which active operations are performed $10^6$ times, the specific word line needs to be activated once or more per 8 active operations. Accordingly, if the mean activation number is less than 1 per 8 active operations, an address of the specific word line may be deleted because the specific word line cannot become active by the reference number or more.

The target address generation unit 1070 may store an address DADD detected by the address detection unit 1060 when the detection signal DET is activated and generate a target address TAR_ADD using the detected address DADD when the second refresh signal REF2 is activated. Here, the target address TAR_ADD may be an address of a word line adjacent to a highly active word line. The target address generation unit 1070 may generate the target address TAR_ADD by subtracting 1 from a value of the detected address DADD or adding 1 to a value of the detected address DADD when the second refresh signal REF2 is activated. If a highly active word line is a $K^{th}$ word line WLK, a value obtained by subtracting 1 from a value of the detected address DADD may correspond to a $(K-1)^{th}$ word line WLK−1 and a value obtained by adding 1 to a value of the detected address DADD may correspond to a $(K+1)^{th}$ word line WLK+1.

The row control unit 1080 may activate a word line corresponding to an input address IADD in response to the active command ACT and may precharge an activated word line in response to the precharge command PRE. The row control unit 1080 may refresh a word line corresponding to the counting address CNT_ADD when the first refresh signal REF1 is activated and may refresh a word line corresponding to the target address TAR_ADD when the second refresh signal REF2 is activated.

The memory device may minimize an area of the address detection unit 1060 and also effectively detect a highly input active address because the number of addresses that needs to be stored by the address detection unit 1060 is minimized by taking a maximum number of highly input active addresses that may be detected in a set section into consideration.

Figure 11:
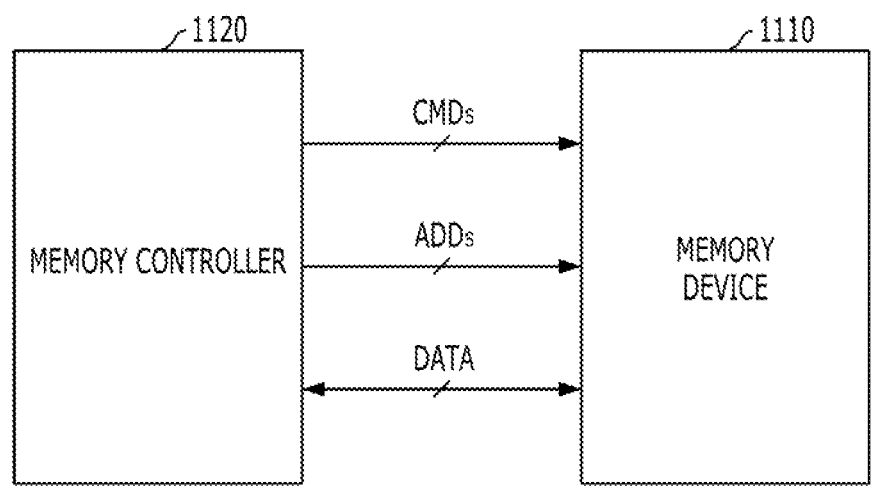
FIG. 11 is a diagram of a memory system according to an embodiment of the present invention.

FIG. 11 is a diagram of a memory system according to an embodiment of the present invention.

As shown in FIG. 11, the memory system may include a memory device 1110 and a memory controller 1120.

The memory controller 1120 controls the operation of the memory device 1110 by applying the command signals CMDs and the addresses ADDs to the memory device 1110 and exchanging data DATA with the memory device 1110 upon read and write operations. The memory controller 1120 may input the active command ACT, the precharge command PRE, the refresh command REF, or the target refresh command TRR to the memory device 1110 by sending the command signals CMDs. If the active command ACT is sought to be inputted, the memory controller 1120 may send the addresses ADDs for selecting a word line that will be activated in the memory device 1110. The memory controller 1120 may periodically send the refresh command REF to the memory device 1110 and may send the target refresh command TRR to the memory device 1110 if target refresh is necessary (depending on the design).

If the target refresh command TRR is sought to be generated, the memory controller 1120 may generate the target refresh command TRR whenever the refresh command REF is generated a set number of times or generate the target refresh command TRR when a signal indicating that a highly active address has been detected is received from the memory device 1110.

The memory device 1110 may be the memory device described above with reference to FIG. 10. The memory device 1110 may detect an address of a highly active word line. The memory device 1110 may detect and store an address of a highly active word line and may generate the target address TAR_ADD when performing a target refresh operation. For reference, the construction and operation necessary for the memory device 1110 to detect an address of a highly active word line is the same as that described with reference to FIGS. 3 to 9.

The memory device 1110 may perform a normal refresh operation in response to the refresh command REF. When the refresh command REF is received a set number of times or the refresh command REF is received or the target refresh command TRR is received after a highly active address is detected, the memory device 1110 may perform a target refresh operation. For reference, the construction and operation that is necessary for the memory device 1110 to detect refresh operations is the same as that described with reference to FIG. 10.

The memory system may prevent concerns attributable to word line disturbance by performing an additional refresh on word lines adjacent to a highly active word line. Furthermore, the memory system may have a reduced size by minimizing the circuit area required for detecting a highly active word line.

For reference, in the examples described with reference to FIGS. 4 to 10, a value of N has been illustrated as being the same as a value obtained by dividing a total input number (or a total active operation number) by a reference number. For example, a value of N may be designed to be greater than a value obtained by dividing a total input number (or a total active operation number) by a reference number by taking a margin into consideration. Furthermore, in the above examples, an example of 'N=8 ($10^6/1.25 \times 10^5=8$)' has been taken, however if N is chosen to be greater than 8 (e.g., 9 or 10), a highly active address may be detected more stably.

According to the embodiments of the present invention, the size of a memory device may be reduced by reducing the area of the circuit for detecting a highly active word line.

Further, data stored in memory cells coupled to a word line adjacent to a highly active word line may be prevented from being damaged by performing a target refresh.

Although various embodiments have been described for illustrative purposes, it will be apparent to those skilled in the art that various changes and modifications may be made without departing from the spirit and scope of the invention as defined in the following claims.

What is claimed is:

1. An address detection circuit, comprising:
   one or more address storage units;
   an initialization unit suitable for deleting an address stored in an address storage unit having a value greater than N, wherein the value is obtained by dividing a respective total input number that addresses have been inputted after the corresponding address is stored by a respective input number corresponding to the stored address;
   a detection unit suitable for detecting an address having an input number that is a reference number or more from the addresses stored in the one or more address storage units; and
   a selection unit suitable for selecting an address storage unit in which an address is not stored and storing an input address in the selected address storage unit.

2. The address detection circuit of claim 1, wherein the one or more address storage units comprise first to $N^{th}$ address storage units.

3. The address detection circuit of claim 2, wherein if a number of address storage units in which an address has not been stored, of the first to $N^{th}$ address storage units, is 2 or more, the selection unit selects an address storage unit having an earlier number and stores an input address in the selected address storage unit.

4. The address detection circuit of claim 1, wherein the N is a natural number greater than a value obtained by dividing a total address input number for a set section by the reference number.

5. The address detection circuit of claim 1, wherein the initialization unit comprises:
   one or more input number counting units each suitable for counting a number of times that an address stored in a corresponding address storage unit is inputted;
   one or more total input number counting units each suitable for counting a total number of times that an address is inputted after a value stored in a corresponding address storage unit is updated; and
   one or more initialization signal generation units each suitable for activating a corresponding initialization signal if a value obtained by dividing a counting value of a corresponding total input number counting unit by a counting value of a corresponding input number counting unit is greater than N.

6. The address detection circuit of claim 5, wherein the counting values of the one or more input number counting units and the one or more total input number counting units are initialized when corresponding initialization signals are activated.

7. The address detection circuit of claim 5, wherein:
   an address detected by the detection unit is deleted from the corresponding address storage unit, and
   the counting values of an input number counting unit and a total input number counting unit corresponding to the address storage unit in which the detected address is stored are initialized.

8. The address detection circuit of claim 5, wherein each of the one or more initialization signal generation units activates a corresponding initialization signal if a value obtained by shifting a counting value of a corresponding input number counting unit by set bits is greater than a counting value of a corresponding total input number counting unit.

9. An address detection circuit, comprising:
   one or more address storage units;
   an initialization unit suitable for deleting an address stored in an address storage unit, which has a mean input number for the corresponding address less than a predetermined number;
   a detection unit suitable for detecting an address having an input number that is a reference number or more from addresses stored in the one or more address storage units; and
   a selection unit suitable for selecting an address storage unit in which an address is not stored and storing an input address in the selected address storage unit.

10. The address detection circuit of claim 9, wherein the one or more address storage units comprise first to $N^{th}$ address storage units.

11. The address detection circuit of claim 9, wherein the N is a natural number greater than a value obtained by dividing a total address input number for a set section by the reference number.

12. The address detection circuit of claim 9, wherein the mean input number corresponds to a value obtained by multiplying a value, obtained by dividing a respective input number corresponding address is stored by a respective total input number that addresses have been inputted after the corresponding address is stored, and N.

13. The address detection circuit of claim 9, wherein the address detected by the detection unit is deleted from the corresponding address storage unit.

14. A memory device, comprising:
   a plurality of word lines having one or more memory cells coupled thereto;
   an address detection unit suitable for storing an address inputted along with an active command, deleting an address whose mean input number is less than 1 per N address inputs, of stored addresses, and detecting an address whose input number is a reference number or more from the stored addresses; and
   a control unit suitable for activating a word line corresponding to an inputted address in response to the active command and refreshing a word line selected using the address detected by the address detection unit.

15. The memory device of claim 14, wherein the address detection unit stores a maximum of N addresses.

16. The memory device of claim 15, wherein the N is a natural number greater than a value obtained by dividing a total address input number for a set section by the reference number.

17. The memory device of claim 14, wherein the mean input number corresponds to a value obtained by multiplying a value, obtained by dividing a respective input number corresponding address is stored by a respective total input number that addresses have been inputted after the corresponding address is stored, and N.

18. The memory device of claim 14, wherein the control unit sequentially refreshes the plurality of word lines in response to a refresh command that is periodically inputted, and refreshes one or more adjacent word lines adjacent to a word line corresponding to an address detected by the address detection unit whenever the refresh command is inputted a set number of times.

19. The memory device of claim 14, wherein the control unit sequentially refreshes the plurality of word lines in response to a refresh command that is periodically inputted, and refreshes one or more adjacent word lines adjacent to a word line, corresponding to an address detected by the address detection unit, in response to the refresh command inputted after the address detection unit detects the address.

20. The memory device of claim 14, wherein the control unit sequentially refreshes the plurality of word lines in response to a refresh command that is periodically inputted, and refreshes one or more adjacent word lines adjacent to a word line corresponding to an address detected by the address detection unit in response to a target refresh command.

* * * * *